United States Patent
Shu et al.

(10) Patent No.: US 12,411,178 B2
(45) Date of Patent: Sep. 9, 2025

(54) METHOD FOR ESTIMATING THE STATE OF HEALTH OF LITHIUM-ION BATTERIES CONSIDERING USER CHARGING BEHAVIOR

(71) Applicant: Chongqing University of Technology, Chongqing (CN)

(72) Inventors: Xing Shu, Chongqing (CN); Yuanzhi Hu, Chongqing (CN); Dong Guo, Chongqing (CN); Renhua Feng, Chongqing (CN); Hongqian Zhao, Chongqing (CN); Meiyan Zhou, Chongqing (CN)

(73) Assignee: Chongqing University of Technology, Chongqing (CN)

( * ) Notice: Subject to any disclaimer, the term of this patent is extended or adjusted under 35 U.S.C. 154(b) by 0 days.

(21) Appl. No.: 19/053,379

(22) Filed: Feb. 13, 2025

(65) Prior Publication Data

US 2025/0180654 A1 Jun. 5, 2025

(30) Foreign Application Priority Data

Feb. 23, 2024 (CN) .......................... 202410202656.5

(51) Int. Cl.
G06F 11/30 (2006.01)
G01R 31/367 (2019.01)
G01R 31/392 (2019.01)

(52) U.S. Cl.
CPC ......... G01R 31/367 (2019.01); G01R 31/392 (2019.01)

(58) Field of Classification Search
CPC .................................................. G01R 31/367
See application file for complete search history.

(56) References Cited

U.S. PATENT DOCUMENTS

2023/0127651 A1  4/2023  Cella et al.

FOREIGN PATENT DOCUMENTS

| CN | 112083334 A | 12/2020 |
|---|---|---|
| CN | 115389946 A | 11/2022 |
| CN | 116047300 A | 5/2023 |
| CN | 116338470 A | 6/2023 |
| CN | 116859259 A | 10/2023 |

*Primary Examiner* — Phuong Huynh
(74) *Attorney, Agent, or Firm* — JEEN IP LAW, LLC

(57) ABSTRACT

A method for estimating the state of health of lithium-ion batteries considering user charging behavior is provided. Firstly, data during the cycle charging process of the actual vehicles are collected, and it is analyzed. Then, the charging process data is applied to extract health features. The obtained health features are used to establish a state of health estimation model, and the established model is used to estimate the state of health of the battery. It involves reading the charging data, analyzing the frequency and occurrence of the start charging voltage and stop charging voltage, integrating them into a heat map, and drawing the IC curve of the charging and discharging process. This enables any charging behavior to extract the health features of battery aging, and predicts the health values of the battery, thus completing the estimation of the state of health for lithium-ion batteries.

2 Claims, 6 Drawing Sheets

METHOD FOR ESTIMATING THE STATE OF HEALTH OF LITHIUM-ION BATTERIES CONSIDERING USER CHARGING BEHAVIOR

CROSS-REFERENCE TO RELATED APPLICATION

This application claims priority of Chinese Patent Application No. 202410202656.5, filed on Feb. 23, 2024, the entire contents of which are incorporated herein by reference.

TECHNICAL FIELD

The present disclosure relates to the technical field of lithium-ion batteries, in particular to a method for estimating the state of health of lithium-ion batteries considering user charging behavior.

BACKGROUND

As a key component for energy storage and electric vehicle power source, the performance and cycle life of battery have attracted much attention. The state of health of battery is one of the key parameters inside lithium-ion batteries, and its accurate estimation can help avoid excessive use of battery, ensure battery safety, and provide reference for estimating the state of charge of battery. However, due to the complex chemical reactions inside battery, existing methods are difficult to guarantee their estimation accuracy. Currently, machine learning methods are mainly used for estimating the state of health of lithium-ion batteries, but this method requires first extracting appropriate health features and then using advanced machine learning methods to estimate the state of health. In existing health feature extraction methods, complete charging or discharging process data are usually required, which cannot be met in practical use. In addition, the charging behavior of the battery is a random process, and users can start charging from any voltage and end at any voltage. Therefore, using only a fixed voltage to extract health features cannot extract corresponding health features during each charging process, resulting in a decrease in the frequency of obtaining the state of health of the battery.

SUMMARY

(1) Technical Problems Solved

In view of the shortcomings of existing technology, the present disclosure provides a method for estimating the state of health of lithium-ion batteries considering user charging behavior, which has the advantages of high model fitting degree and high estimation accuracy, and solves the above-mentioned technical problems.

(2) Technical Solution

To achieve the above objectives, the present disclosure provides the following technical solution: a method for estimating the state of health of lithium-ion batteries considering user charging behavior, including the following steps:

S1, collecting the data in the cycle charging process of actual vehicle;

S2, analyzing the collected charging data;

S3, extracting data from a battery charging process during a cycling process as health features;

S4, establishing a state of health estimation model based on the health features obtained in S3;

S5, estimating a state of health of the battery using the model established in S4.

As the preferred technical solution of the present disclosure, the data collected in S1 is obtained by carrying out a cyclic charging test on different types of lithium-ion batteries until the discharge capacity of each type of battery is lower than 80% of the nominal capacity, and further includes real-time recording the data of battery charging voltage, charging capacity, charging start charging voltage, and stop charging voltage.

As the preferred technical solution of the present disclosure, the analysis process in S2 is as follows:

S2.1, reading the frequency of occurrence of start charging voltage and stop charging voltage during the cyclic charging process of lithium-ion batteries;

S2.2, calculating the frequency of occurrence of different start charging voltage and stop charging voltage;

S2.3, establishing a clustered bar chart based on the frequency of occurrence of the start charging voltage and stop charging voltage in S2.1, and integrating it with the frequency of occurrence of the start charging voltage and stop charging voltage in S2.2 to create a heat map;

As the preferred technical solution of the present disclosure, the specific process of setting the health features in S3 is as follows:

S3.1, establishing the IC curve during a charging process;
S3.2, denoising the data during S3.1;
S3.3, determining health features;

As the preferred technical solution of the present disclosure, the process of establishing the IC curve in S3.1 is as follows:

S3.1.1, determining a relationship between capacity and voltage, with the specific expression as follows:

$$\begin{cases} Q_a = \int I dt \\ V = f(Q_a), Q_a = f^{-1}(V) \end{cases}$$

$$G = (f^{-1})' = \frac{dQ_a}{dV} = \frac{I dt}{dV} = I \frac{dt}{dV}$$

wherein, $Q_a$ represents the charging capacity, I represents the charging current, V represents the battery voltage, $f(Q_a)$ represents the mapping function from $Q_a$ to V, $f^{-1}$ represents the inverse function $f$, G represents the derivative of the inverse function $f^{-1}$, $\int I dt$ represents the integral of the current over time t, $dQ_a$ represents the differential of the charging capacity $Q_a$, dV represents the differential of the battery voltage V, dt represents the differential of time t;

S3.1.2, introducing fitting error and replacing dV in S3.1.1 with a fixed voltage interval $\Delta V$;

As the preferred technical solution of the present disclosure, in a denoising process in S3.2, selecting a Kalman filter algorithm for denoising, and establishing a state equation and a measurement equation, a specific expressions are as follows:

$$\begin{cases} x_k = x_{k-1} + \omega_k \\ y_k = x_k + v_k \end{cases}$$

wherein, $x_k$ represents the incremental capacity data at time k, $w_k$ represents the noise of the control system, $x_{k-1}$ represents the incremental capacity data at time k−1, $y_k$ represents the measurement of noise pollution for $x_k$, and $v_k$ represents the measured noise;

$$\begin{cases} \hat{x}_k^- = \hat{x}_{k-1}^- \\ P_k^- = \hat{P}_{k-1} + Q \\ K_k = P_k^-(P_k^- + R)^{-1} \\ \hat{x}_k = \hat{x}_k^- + K_k(y_k - \hat{x}_k^-) \\ \hat{P}_k = (1 - K_k)P_k^- \end{cases}$$

wherein, Q and R represent the covariance matrices of process noise and measurement noise, respectively, $\hat{x}_k^-$ represents the prior estimation state value at time k, $\hat{x}_{k-1}^-$ represents the prior estimation state value at time k−1, $\hat{x}_k$ represents the posterior estimation state value at time k, $P_k^-$ represents the posterior estimation covariance at time k, $\hat{P}_k$ represents the posterior estimation covariance at time k, $\hat{P}_{k-1}$ represents the posterior estimation covariance at time k−1, and $K_k$ represents the Kalman gain matrix under optimal estimation conditions, and obtaining the IC curve after the calculation is completed;

As the preferred technical solution of the present disclosure, the data selected for health features in S3.3 are the corresponding peak values of two peaks and one valley of the denoised IC curve in S3.2, as well as a median voltage value selected within a voltage range of 3.718V to 4.0V;

As the preferred technical solution of the present disclosure, the specific process of S4 is as follows:

S4.1, establishing a TCN-BiGRU model;

S4.2, taking the first 70% of the cyclic data features obtained in S3 as inputs for a TCN-BiGRU network, and taking the corresponding state of health values as outputs for the TCN-BiGRU network, calculating the battery health values using the TCN-BiGRU network to complete the model construction.

As the preferred technical solution of the present disclosure, the TCN-BiGRU model includes a forward propagation GRU unit and a backward propagation GRU unit with a following operational expression:

$$\vec{h}_t = G(x_t, \vec{h}_{t-1})$$
$$\overleftarrow{h}_t = G(x_t, \overleftarrow{h}_{t-1})$$
$$h_t = w_t\vec{h}_t + v_t\overleftarrow{h}_t + b_t$$

wherein, G(*) represents the definition functions for the forward propagation GRU unit and the backward propagation GRU unit, $h_t$ represents the output at the current time t, $b_t$ represents the bias of the output layer, $w_t$ and $v_t$ represent the weights of the forward GRU output and the backward GRU output at time t, respectively. $\vec{h}_t$ represents the forward output, $\overleftarrow{h}_t$ represents the backward output, and $x_t$ represents the input value.

Compared with existing technologies, the present disclosure provides a method for estimating the state of health of lithium-ion batteries considering user charging behavior, which has the following advantageous effects:

1. According to the present disclosure, by reading the user's charging data and statistically analyzing the frequency and occurrence of the start charging voltage and the stop charging voltage, integrating them into a heat map, and drawing the IC curve of the charging and discharging process, any charging behavior can extract the health features of battery aging, and the battery health values can be predicted based on the established TCN-BiGRU model, thus estimating the state of health of lithium-ion batteries.

BRIEF DESCRIPTION OF THE DRAWINGS

FIG. 1 (B) is a schematic diagram of the frequency of the stop charging voltage collected by the present disclosure;

DETAILED DESCRIPTION OF THE EMBODIMENTS

The technical solutions in the embodiments of the present disclosure will be described clearly and completely in the following in conjunction with the accompanying drawings in the embodiments of the present disclosure, and it is clear that the described embodiments are only a part of the embodiments of the present disclosure, not all of the embodiments. Based on the embodiments in the present disclosure, all other embodiments obtained by the skilled in the art without making creative labor fall within the scope of the present disclosure.

Please refer to FIGS. 1 to 6, a method for estimating the state of health of lithium-ion batteries considering user charging behavior, including the following steps:

S1, Collecting the data in the cycle charging process of the actual vehicle, the data of the actual vehicle collected in S1 is obtained by carrying out a cyclic charging test on different types of lithium-ion batteries until the discharge capacity of each type of battery is lower than 80% of the nominal capacity, and further includes real-time recording the data of battery charging voltage, charging capacity, start charging voltage, and stop charging voltage of charging, and a total of 17476 charging processes were recorded.

S2, Analyzing the collected charging data.

Figure 1A:
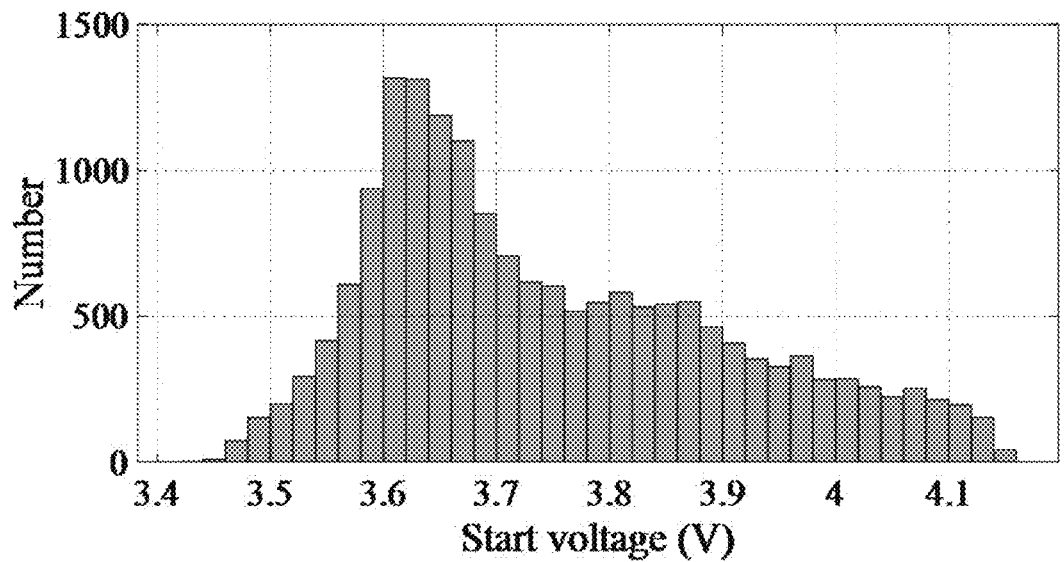
FIG. 1 (A) is a schematic diagram of the frequency of the start charging voltage collected by the present disclosure.
Figure 1B:
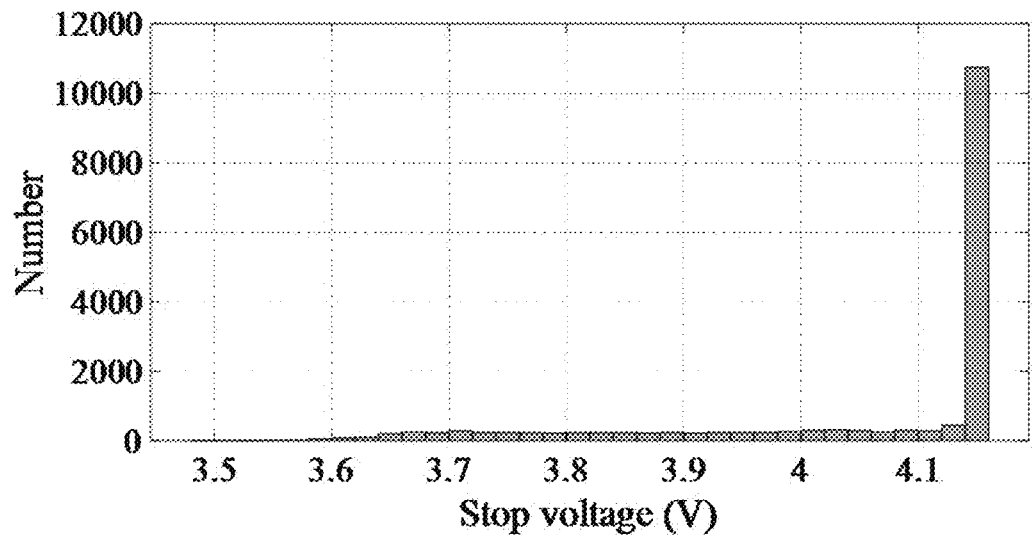
Figure 2:
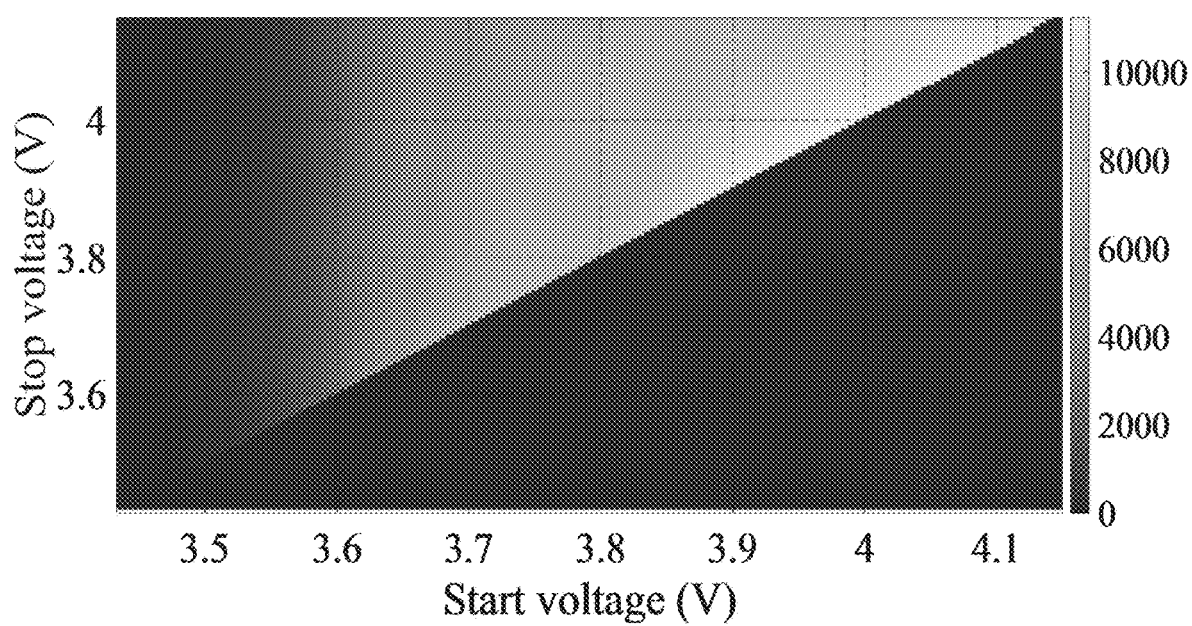
FIG. 2 is a schematic diagram of charging behavior analysis obtained by the implementation of the present disclosure.

Firstly, S2.1, reading the start charging voltage and the stop charging voltage during the cyclic charging process of the lithium-ion batteries. Then, S2.2, counting the frequency of occurrence of different start charging voltages and stop charging voltages. S2.3, counting the frequency of occurrence of the start charging voltages and stop charging voltages, and drawing a clustered column chart based on the statistical data, as shown in FIG. 1 (A) and FIG. 1 (B); integrating the statistical data of the frequency of the start charging voltages and stop charging voltages into a heat map, as shown in FIG. 2, with the horizontal axis representing the start charging voltage and the vertical axis representing the stop charging voltage. If the frequency of the process from start charging voltage A to stop charging voltage B is higher, the color will appear lighter in the map. However, there is always a relationship that the stop charging voltage is greater than or equal to the start charging voltage. Therefore, the lower right corner of the map is in a triangular shape cut by the diagonal, indicating that the frequency of this situation is 0, so the color is the lightest.

S3, Extracting data from the battery charging process during the cycling process as health features.

S3.1, Due to the IC curve is the curve of current versus voltage during battery charging and discharging, it is considered an effective tool for analyzing battery health. Therefore, the IC curves of different charge and discharge cycles will be drawn and gradually compared to further analyze the impact of the charge and discharge process on health features. The specific calculation and drawing process is as follows:

By using the voltage-capacity (V–$Q_a$) curve to calculate the first derivative under constant current charging state, the voltage-capacity change rate curve is obtained, and the voltage interval is set to 1 mV. The relationship between capacity and voltage can be described as:

$$\begin{cases} Q_a = \int I dt \\ V = f(Q_a), Q_a = f^{-1}(V) \end{cases}$$

$$G = (f^{-1})' = \frac{dQ_a}{dV} = \frac{I dt}{dV} = I \frac{dt}{dV}$$

Wherein, $Q_a$ represents the charging capacity, I represents the charging current, V represents the battery voltage, $f(Q_a)$ represents the mapping function from $Q_a$ to V, $f^{-1}$ represents the inverse function $f$, G represents the derivative of the inverse function $f^{-1}$, $\int I dt$ represents the integral of the current over time t, $dQ_a$ represents the differential of the charging capacity $Q_a$, dV represents the differential of the battery voltage V, dt represents the differential of time t, and then fitting the curve V–$Q_a$ will introduce fitting errors. The fixed voltage interval $\Delta V$ is used instead of dV, and $\Delta Q_a$ corresponds to the capacity change in the interval $\Delta V$. When $\Delta V$ approaches 0, approximately:

$$\frac{dQ_a}{dV} \approx \frac{\Delta Q_a}{\Delta V}.$$

S3.2, Due to noise pollution, the extraction of feature parameters in the range of 3.65V-3.75V is hindered. Therefore, the Kalman filter algorithm is selected to denoise the data, and the state equation and measurement equation are established. The specific expressions are as follows:

$$\begin{cases} x_k = x_{k-1} + \omega_k \\ y_k = x_k + v_k \end{cases}$$

Wherein, $x_k$ represents the incremental capacity data at time k, $w_k$ represents the noise of the control system, $x_{k-1}$ represents the incremental capacity data at time k–1, $y_k$ represents the measurement of noise pollution for $x_k$, and $v_k$ represents the measured noise.

The calculation process can be expressed as:

$$\begin{cases} \hat{x}_k^- = \hat{x}_{k-1}^- \\ P_k^- = \hat{P}_{k-1} + Q \\ K_k = P_k^-(P_k^- + R)^{-1} \\ \hat{x}_k = \hat{x}_k^- + K_k(y_k - \hat{x}_k^-) \\ \hat{P}_k = (1 - K_k)P_k^- \end{cases}$$

Figure 3:
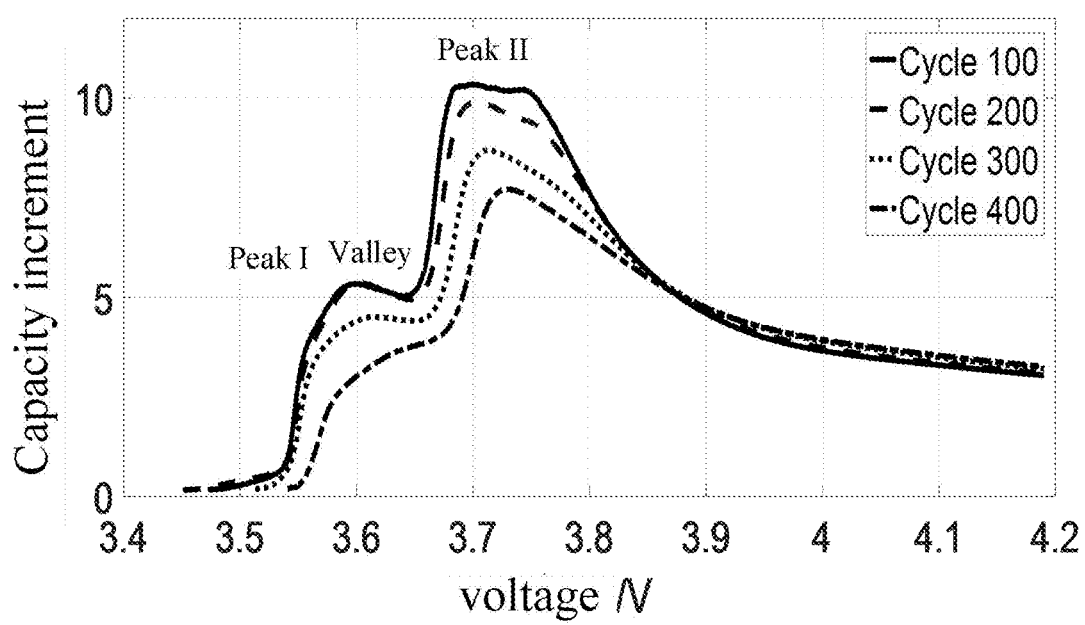
FIG. 3 is a schematic diagram of the IC curve results of the present disclosure.
Figure 4:
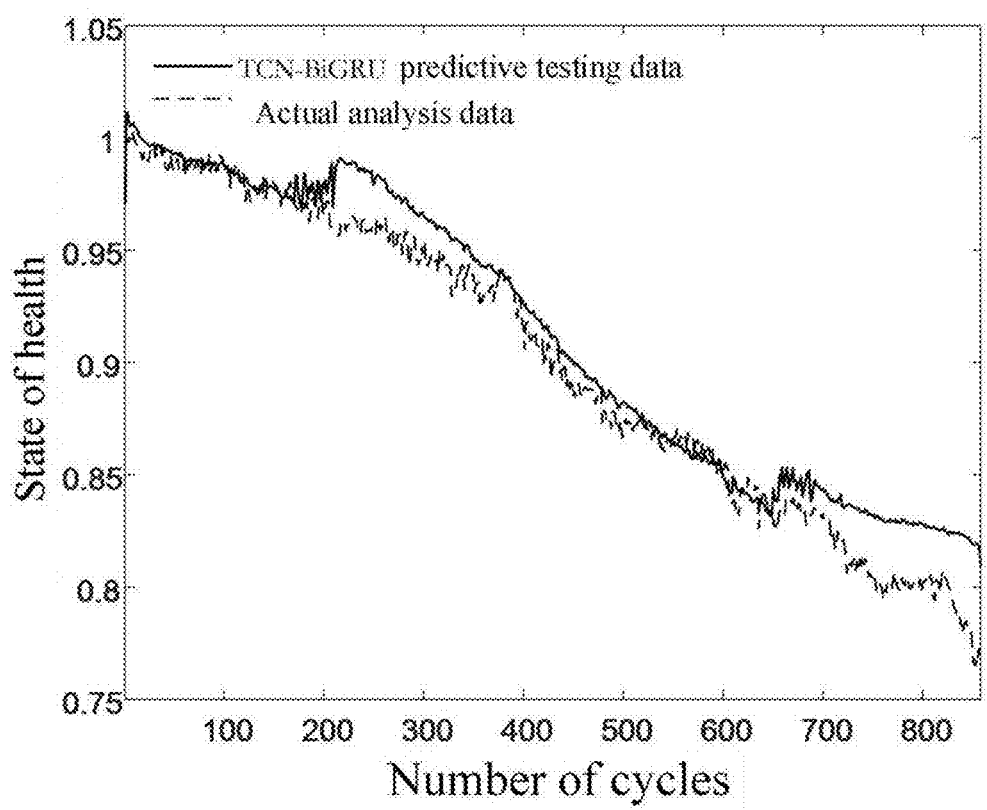
FIG. 4 is a schematic diagram of the state of health estimation results of the present disclosure.
Figure 5:
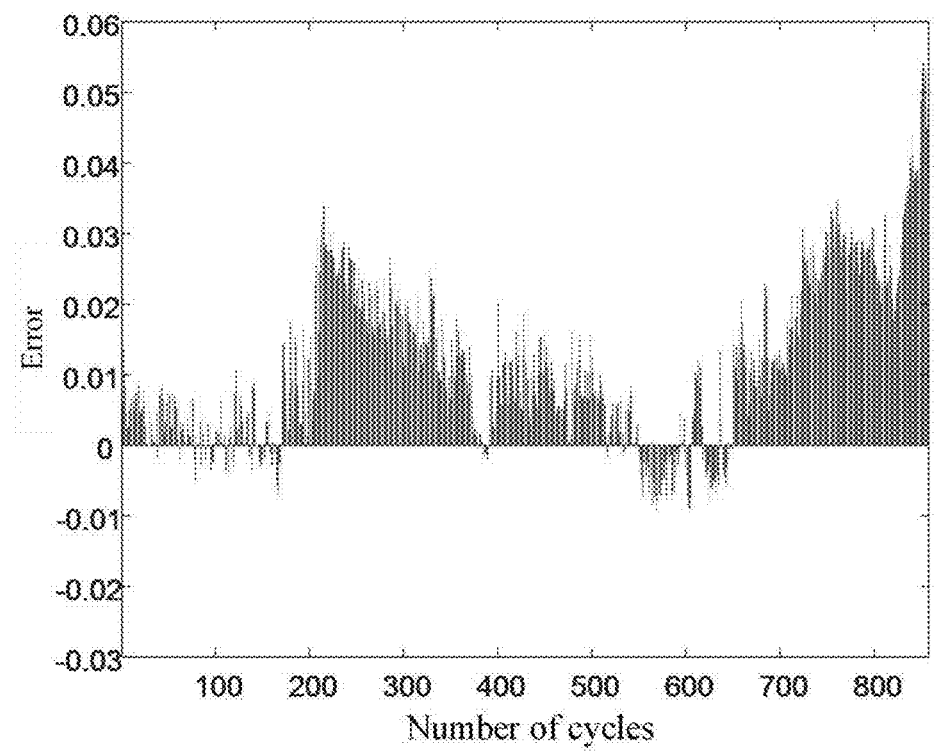
FIG. 5 is a schematic diagram of the state of health estimation error of the present disclosure.
Figure 6:
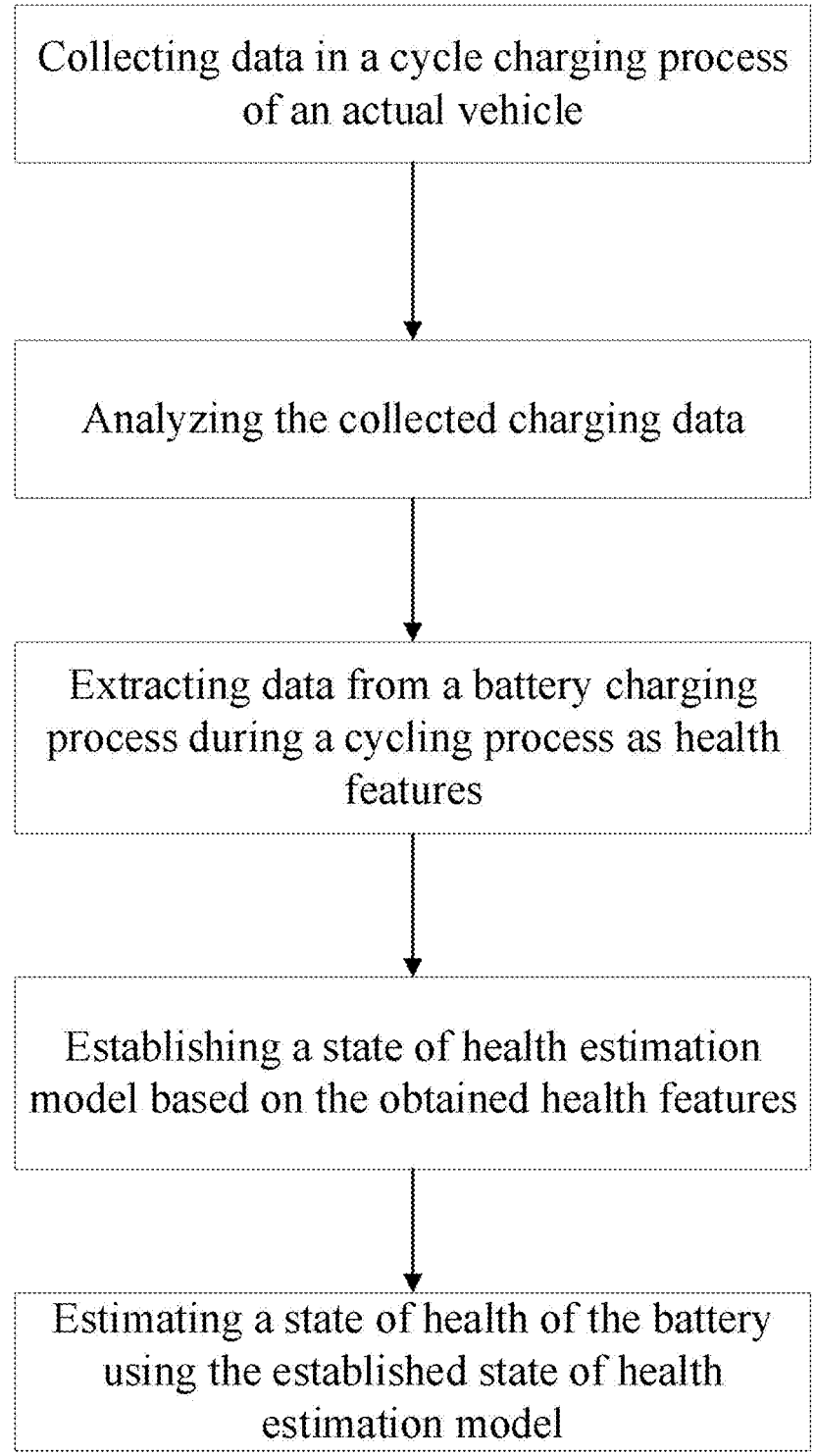
FIG. 6 is a flow chart of the present disclosure.

Wherein, Q and R represent the covariance matrices of process noise and measurement noise, respectively, $\hat{x}_k^-$ represents the prior estimation state value at time k, $\hat{x}_{k-1}^-$ represents the prior estimation state value at time k–1, $\hat{x}_k$ represents the posterior estimation state value at time k, $P_k^-$ represents the posterior estimation covariance at time k (i.e. the covariance between the true value and the predicted value), $\hat{P}_k$ represents the posterior estimation covariance at time k (i.e. the covariance between the true value and the optimal estimation value), $\hat{P}_{k-1}$ represents the posterior estimation covariance at time k–1, and $K_k$ represents the Kalman gain matrix under optimal estimation conditions, and the IC curves filtered with different cycle times are obtained, as shown in FIG. 3.

S3.3, From the figure, it can be seen that there are two peaks and one valley in the IC curve. Therefore, the peak values corresponding to the peaks or the valley is selected as the health features, and the corresponding voltage ranges are shown in the table below. The frequency of occurrence of different voltage ranges is calculated according to S2.1.

| Feature | Start charging voltage | Stop charging voltage | Frequency of occurrence |
|---|---|---|---|
| Peak I | 3.537 | 3.621 | 592 |
| Valley | 3.621 | 3.678 | 3521 |
| Peak II | 3.678 | 3.718 | 6343 |

Based on the frequency of occurrence in the above voltage range, 59.8% of the total charging times can be extracted with corresponding health features. To further increase the frequency of occurrence in different voltage ranges, in addition to the three features mentioned above, the median voltage value in the voltage range of 3.718V to 4.0V is selected, and the frequency of occurrence in this range is 6267. Therefore, the total probability of occurrence of the four features was 95.69%;

| Feature number | Feature | Start charging voltage | Stop charging voltage | Frequency of occurrence |
|---|---|---|---|---|
| 1 | Peak I | 3.537 | 3.621 | 592 |
| 2 | Valley | 3.621 | 3.678 | 3521 |
| 3 | Peak II | 3.678 | 3.718 | 6343 |
| 4 | Median voltage value | 3.718 | 4.0 | 6267 |
| | Total | | | 16723 |

S4, Establishing a state of health estimation model based on the health features obtained in S3.

The first 70% of the cyclic data features obtained in S3 are used as inputs to the TCN BiGRU network, and the corresponding state of health values are used as outputs to complete the construction of the base model. The calculation formula is as follows:

TCN consists of causal convolution, dilated convolution, and a residual block. The causal convolution is used to prevent information leakage. The residual block has two extended causal convolutional layers, two ReLU layers, two normalization layers, and two Dropout layers. One dimensional fully convolutional network is achieved by padding with a length of zero (kernel size of −1). In addition to causal convolution, TCN also uses dilated convolution, the dilated convolution operation F at position $x_t$ is defined as:

$$F(x_t) = (X *_d f)(x_t) = \sum_{i=0}^{k-1} f_{k-1} \cdot x_{t-(k-1-i)d}$$

Wherein, $X=(x_1, x_2, \ldots, x_T)$ is a one-dimensional sequence input. $f=(f_0, f_1, \ldots, f_{k-1})$ represents a filter. $*_d$ represents the dilated convolution operation with dilation factor d, k represents the filter size, and (k−1−i)d represents the past direction. It can increase the acceptance area by increasing the dilation factor. The value of the dilation factor is generally set to 2 i.

The updated equation for BiGRU is:

$$r_t = \sigma(W_r[h_{t-1}, \tilde{x}_t] + b_r)$$
$$z_t = \sigma(W_z[h_{t-1}, \tilde{x}_t] + b_z)$$
$$\tilde{h}_t = \tanh(W_h[r_t h_{t-1}, \tilde{x}_t] + b_h)$$
$$h_t = (1 - z_t)h_{t-1} + z_t \tilde{h}_t$$

Wherein, r is the reset gate and z is the update gate, which control the process from the previous hidden state $h_{t-1}$ to the new hidden state $h_t$. x is the input data, $\tilde{h}$ is the new memory information, and $h_t$ is the output at the current time t. $W_r$, $W_z$ and $W_h$ represent the calculated weights, $b_r$, $b_z$ and $b_h$ represent deviations, and σ is the activation function.

The TCN-BiGRU model includes a forward propagation GRU unit and a backward propagation GRU unit, with the following operational expression:

$$\overrightarrow{h}_t = G(x_t, \overrightarrow{h}_{t-1})$$
$$\overleftarrow{h}_t = G(x_t, \overleftarrow{h}_{t-1})$$
$$h_t = w_t \overrightarrow{h}_t + v_t \overleftarrow{h}_t + b_t$$

Wherein, G(*) represents the definition functions for the forward propagation GRU unit and the backward propagation GRU unit, $h_t$ represents the output at the current time t, $b_t$ represents the bias of the output layer, $w_t$ and $v_t$ represent the weights of the forward GRU output and the backward GRU output at time t, respectively. $\overrightarrow{h}_t$ represents the forward output, $\overleftarrow{h}_t$ represents the backward output, and $x_t$ represents the input value.

S5, Estimating the state of health of the battery by the model established in S4. Based on the TCN-BiGRU network established in S4, taking the peak I, the valley, the peak II and the median voltage value in the voltage range of 3.718V to 4.0V as inputs to predict the state of health values.

Although the embodiments of the present disclosure have been shown and described, it will be understood by those skilled in the art that various changes, modifications, substitutions, and variations can be made to these embodiments without departing from the principles and spirit of the present disclosure. The scope of the present disclosure is limited by the appended claims and their equivalents.

What is claimed is:

1. A method for estimating a state of health of lithium-ion batteries considering user charging behavior, comprising the following steps:
   S1, collecting data in a cycle charging process of an actual vehicle, wherein the data collected in S1 is obtained by carrying out a cyclic charging test on different types of lithium-ion batteries until a discharge capacity of each type of batteries is lower than 80% of a nominal capacity, and further comprises real-time recording data of battery charging voltage, charging capacity, start charging voltage and stop charging voltage of charging;
   S2, analyzing the collected charging data;
   an analysis process in S2 is as follows:
   S2.1, reading a frequency of occurrence of the start charging voltage and the stop charging voltage during the cyclic charging process of lithium-ion batteries;
   S2.2, calculating the frequency of occurrence of different start charging voltage and stop charging voltage;
   S2.3, establishing a clustered bar chart based on the frequency of occurrence of the start charging voltage and the stop charging voltage in S2.1, and integrating it with the frequency of occurrence of the start charging voltage and the stop charging voltage in S2.2 to create a heat map;
   S3, extracting data from a battery charging process during a cycling process as health features;
   a specific process of setting the health features in S3 is as follows:
   S3.1, establishing a IC curve during the battery charging process;
   the process of establishing the IC curve in S3.1 is as follows:
   S3.1.1, determining a relationship between capacity and voltage, with an expression as follows:

$$\begin{cases} Q_a = \int I dt \\ V = f(Q_a), Q_a = f^{-1}(V) \end{cases}$$
$$G = (f^{-1})' = \frac{dQ_a}{dV} = \frac{Idt}{dV} = I\frac{dt}{dV}$$

wherein, $Q_a$ represents a charging capacity, I represents charging current, V represents battery voltage, $f(Q_a)$ represents a mapping function from $Q_a$ to V, $f^{-1}$ represents an inverse function of $f$, G represents a derivative of the inverse function $f^{-1}$, $\int I dt$ represents an integral of the current over time t, $dQ_a$ represents a differential of the charging capacity $Q_a$, dV represents a differential of the battery voltage V, dt represents a differential of time t;
   S3.1.2, introducing fitting error, and replacing dV in S3.1.1 with a fixed voltage interval ΔV;
   S3.2, denoising the data during S3.1;
   in a denoising process in S3.2, selecting a Kalman filter algorithm for denoising, and establishing a state equation and a measurement equation; the expressions are deduced as follows:

$$\begin{cases} x_k = x_{k-1} + \omega_k \\ y_k = x_k + v_k \end{cases}$$

wherein, $x_k$ represents incremental capacity data at time k, $\omega_k$ represents noise of a control system, $x_{k-1}$ represents incremental capacity data at time k−1 $y_k$ represents measurement of noise pollution for $x_k$, and $v_k$ represents measured noise;

$$\begin{cases} \hat{x}_k^- = \hat{x}_{k-1}^- \\ P_k^- = \hat{P}_{k-1} + Q \\ K_k = P_k^-(P_k^- + R)^{-1} \\ \hat{x}_k = \hat{x}_k^- + K_k(y_k - \hat{x}_k^-) \\ \hat{P}_k = (1 - K_k)P_k^- \end{cases}$$

wherein, Q and R represent covariance matrices of process noise and measurement noise, respectively, $\hat{x}_k^-$ represents a prior estimation state value at time k, $\hat{x}_{k-1}^-$ represents a prior estimation state value at time k−1, $\hat{x}_k$ represents a posterior estimation state value at time k, $P_k^-$ represents a posterior estimation covariance at time k, $\hat{P}_k$ represents a posterior estimation covariance at time k, $\hat{P}_{k-1}$ represents a posterior estimation covariance at time k−1, and $K_k$ represents a Kalman gain matrix under optimal estimation conditions, and the IC curve is obtained after the calculation is completed;

S3.3, determining the health features;

the data selected for the health features in S3.3 are corresponding peak values of two peaks and one valley of the denoised IC curve in S3.2, as well as a median voltage value selected within a voltage range of 3.718V to 4.0V;

S4, establishing a state of health estimation model based on the health features obtained in S3; wherein a process of S4 comprises:

S4.1, establishing a TCN-BiGRU model;

S4.2, taking the first 70% of the cyclic data features obtained in S3 as inputs for a TCN-BiGRU network, and taking the corresponding state of health values as outputs for the TCN-BiGRU network, calculating the battery health values using the TCN-BiGRU network to complete the model construction;

S5, estimating a state of health of the battery using the state of health estimation model established in S4.

2. The method for estimating the state of health of lithium-ion batteries considering user charging behavior according to claim 1, wherein the TCN-BiGRU model comprises a forward propagation GRU unit and a backward propagation GRU unit with a following operational expression:

$$\vec{h}_t = G(x_t, \vec{h}_{t-1})$$

$$\overleftarrow{h}_t = G(x_t, \overleftarrow{h}_{t-1})$$

$$h_t = w_t \vec{h}_t + v_t \overleftarrow{h}_t + b_t$$

wherein, G(*) represents definition functions for the forward propagation GRU unit and the backward propagation GRU unit; $h_t$ represents an output at the current time t; $b_t$ represents bias of an output layer; $w_t$ and $v_t$ represent weights of the forward GRU output and the backward GRU output at time t, respectively; $\vec{h}_t$ represents an forward output; $\overleftarrow{h}_t$ represents a backward output; and $x_t$ represents an input value.

* * * * *